United States Patent
Sharon et al.

(10) Patent No.: US 9,268,635 B2
(45) Date of Patent: Feb. 23, 2016

(54) ERROR CORRECTION USING MULTIPLE DATA SOURCES

(71) Applicant: SANDISK TECHNOLOGIES INC., Plano, TX (US)

(72) Inventors: Eran Sharon, Rishon Lezion (IL); Ariel Navon, Revava (IL); Noam Presman, Givatayim (IL)

(73) Assignee: SANDISK TECHNOLOGIES INC., Plano, TX (US)

( * ) Notice: Subject to any disclaimer, the term of this patent is extended or adjusted under 35 U.S.C. 154(b) by 108 days.

(21) Appl. No.: 14/284,103

(22) Filed: May 21, 2014

(65) Prior Publication Data

US 2015/0339186 A1 Nov. 26, 2015

(51) Int. Cl.
*H03M 13/00* (2006.01)
*G06F 11/10* (2006.01)
*H03M 13/11* (2006.01)

(52) U.S. Cl.
CPC ........ *G06F 11/1016* (2013.01); *G06F 11/1072* (2013.01); *H03M 13/1108* (2013.01); *H03M 13/1111* (2013.01)

(58) Field of Classification Search
None
See application file for complete search history.

(56) References Cited

U.S. PATENT DOCUMENTS

| | | | | |
|---|---|---|---|---|
| 7,242,632 B2 * | 7/2007 | Hiraka | ...................... | G06F 3/061 365/185.29 |
| 7,487,303 B2 * | 2/2009 | Song | ........................ | G06F 3/061 711/103 |
| 7,552,273 B2 * | 6/2009 | Otterstedt | ............ | G06Q 20/341 365/185.02 |
| 7,900,125 B1 | 3/2011 | Liu et al. | | |
| 8,700,975 B2 * | 4/2014 | Yoshihara | ........... | G06F 11/1412 714/770 |
| 8,762,810 B2 * | 6/2014 | Otsuka | .............. | H03M 13/2906 714/758 |
| 8,984,374 B2 * | 3/2015 | Yoshihara | ........... | G06F 11/1412 714/52 |
| 2008/0104486 A1 | 5/2008 | Kanaoka | | |
| 2008/0168333 A1 | 7/2008 | Yamamoto et al. | | |
| 2009/0158127 A1 | 6/2009 | Miyauchi et al. | | |
| 2009/0158128 A1 | 6/2009 | Yokokawa et al. | | |
| 2011/0252289 A1 | 10/2011 | Patapoutian et al. | | |

FOREIGN PATENT DOCUMENTS

WO  2008075351 A2  6/2008
WO  2009072103 A2  6/2009

OTHER PUBLICATIONS

Winstead, Chris "Analog Soft Decoding for Multi-Level Memories," Proceedings of the 35th International Symposium on Multiple-Valued Logic (ISMVL '05), May 19-21, 2005, pp. 1-6.

* cited by examiner

*Primary Examiner* — Esaw Abraham
(74) *Attorney, Agent, or Firm* — Toler Law Group, PC

(57) ABSTRACT

A data storage device includes a memory and a controller. A method includes accessing data stored at the memory to generate a first logical page. The method further includes generating a second logical page. Generating the second logical page includes accessing parity information from the memory. The parity information is associated with the first logical page. The method further includes generating a third logical page. Generating the third logical page includes modifying a first value of the first logical page based on a second bit value of the second logical page.

30 Claims, 3 Drawing Sheets

ERROR CORRECTION USING MULTIPLE DATA SOURCES

FIELD OF THE DISCLOSURE

The present disclosure is generally related to error correction in a data storage device.

BACKGROUND

Non-volatile data storage devices have enabled increased portability of data and software applications. For example, multi-level cell (MLC) storage elements of a flash memory device may each store multiple bits of data, enhancing data storage density as compared to single-level cell (SLC) flash memory devices. Consequently, flash memory devices enable users to store and access a large amount of data. As a number of bits stored per cell increases, bit errors in stored data typically increase.

SLC and MLC flash memory devices may use error correcting code (ECC) techniques to correct a number of errors in read data up to a certain error correction capability of the particular ECC technique used to encode the data. If the number of errors exceeds the error correction capability of the particular ECC technique used, an uncorrectable ECC (UECC) error may occur, resulting in data loss. In some cases, error correction capability may be increased by using "soft" information that indicates a probability of bits having a particular bit value. For example, a decoder of a flash memory device may use additional "soft" bits to determine which "hard" bits of read data are likely to be incorrect. Such soft bit techniques may increase error correction capability of a flash memory device but may also use processing resources and/or increase read latency at the flash memory device, which may decrease performance of the flash memory device.

SUMMARY

Error correction capability of a data storage device may be improved by combining multiple inputs of data having different reliabilities in order to generate a combined input to a decoder of the data storage device. For example, the data storage device may replace unreliable bits of a first logical page with bits of a second logical page to generate the combined input. If the multiple inputs are combined prior to attempting to decode any of the multiple inputs, reliability of the inputs is taken into account prior to initiating a decoding operation. The techniques illustrated herein may therefore enable use of reliability information in connection with a "hard" decoder, such as a hard Bose-Chaudhuri-Hocquenghem (BCH) decoder, that does not use soft bit information. Alternatively or in addition, techniques of the present disclosure may be used to increase error correction capability of a soft decoder.

To further illustrate, a block of the data storage device may store data indicating logical pages and may further store parity information associated with the logical pages. For example, the data storage device may perform an exclusive-OR (XOR) operation using the logical pages to generate the parity information and may store the parity information at the block. If an error rate of a logical page stored at the block exceeds the error correction capability of the decoder, the logical page may be recovered using the parity information, such as by performing a XOR operation using the parity information and the other logical pages of the block to generate a reconstructed version of the logical page.

If two or more of the logical pages have error rates exceeding the error correction capability, the reconstructed version of the logical page may be unreliable. In this example, neither the logical page nor the reconstructed version of the logical page have error rates within the error correction capability of the data storage device, resulting in a read failure associated with an attempt to read the logical page (i.e., a "failed" page). In a data storage device with a hard decoder, data loss may occur in this case. Other data storage devices may use soft bit techniques to attempt to recover the failed page, but these techniques may consume processing resources and may increase read latency. A data storage device in accordance with the present disclosure may utilize bits of both the failed page and the reconstructed logical page to recover the logical page. For example, "correct" bits can be recovered from both the failed page and the reconstructed logical page to generate a recovered version of the failed logical page having a bit error rate that is within the error correction capacity of the decoder. Accordingly, multiple data input sources can be used to improve accuracy of read data in connection with a hard decoder.

DETAILED DESCRIPTION

Figure 1:
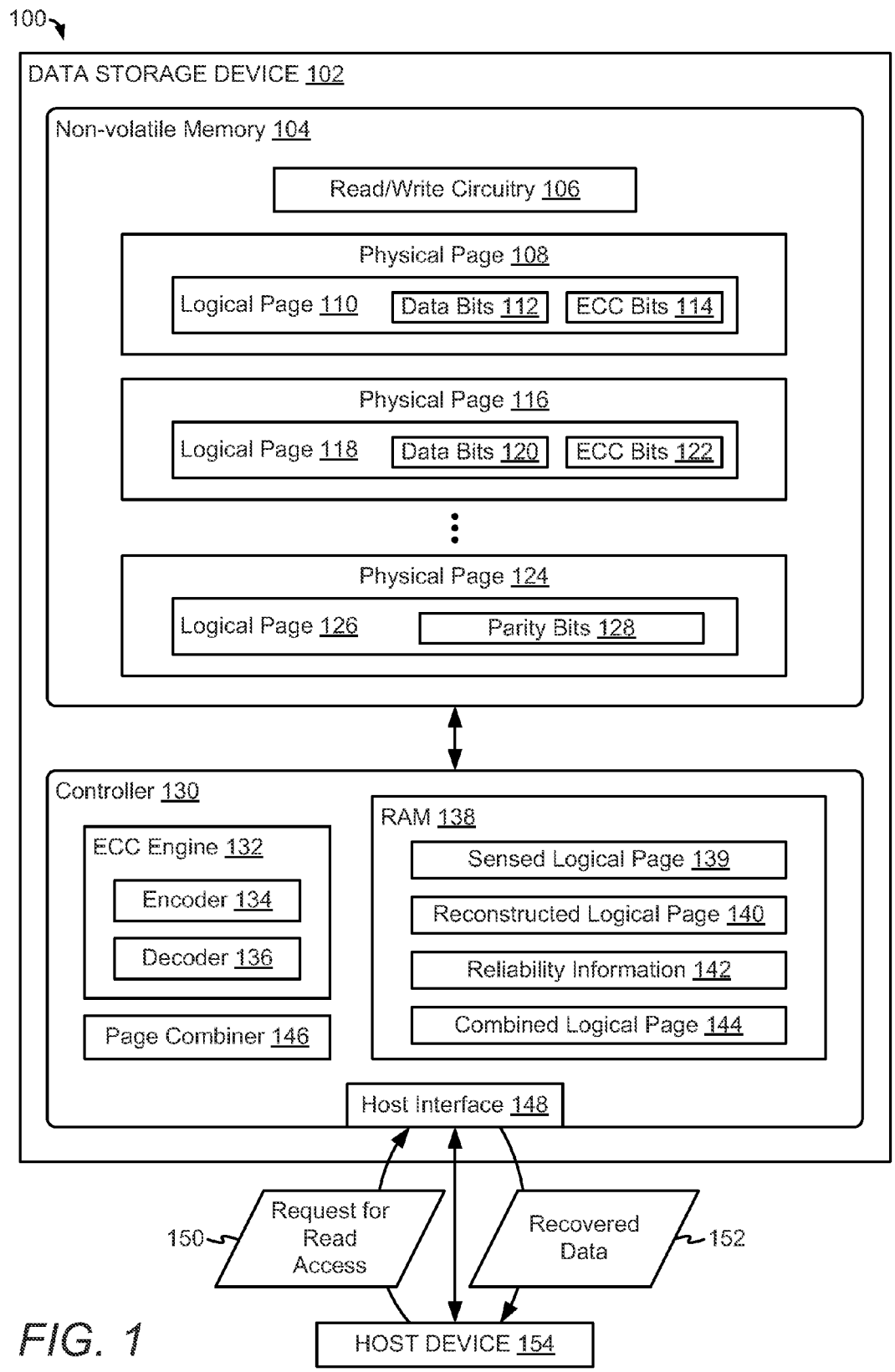
FIG. 1 is a diagram of a particular illustrative example of a system that includes a data storage device.

Referring to FIG. 1, a particular illustrative embodiment of a system is depicted and generally designated 100. The system 100 includes a data storage device 102 and a host device 154. The data storage device 102 and the host device 154 may be coupled via a connection, such as a wireless connection or a bus. The data storage device 102 may be embedded within the host device 154, such as in accordance with a Joint Electron Devices Engineering Council (JEDEC) Solid State Technology Association Universal Flash Storage (UFS) configuration. Alternatively, the data storage device 102 may be removable from the host device 154 (i.e., "removably" coupled to the host device 154). As an example, the data storage device 102 may be removably coupled to the host device 154 in accordance with a removable universal serial bus (USB) configuration.

The data storage device 102 may include a memory, such as a non-volatile memory 104. The non-volatile memory 104 may have a three-dimensional (3D) memory configuration. As an illustrative example, the non-volatile memory 104 may include one or more layers having a first orientation and may further include one or more elements, such as vertical columns, having a second orientation perpendicular to (or approximately perpendicular to) the first orientation to enable cross-layer coupling of storage elements of the one or more layers. Alternatively, the non-volatile memory 104 may have another configuration, such as a two-dimensional (2D) memory configuration.

The data storage device 102 may further include a controller 130. The non-volatile memory 104 and the controller 130 may be coupled via a connection, such as a bus. The non-volatile memory 104 may include read/write circuitry 106. In a particular implementation, the non-volatile memory 104 is a non-volatile memory having a three-dimensional (3D) memory configuration that is monolithically formed in one or more physical levels of arrays of memory cells having an active area disposed above a silicon substrate. The data storage device 102 includes circuitry, such as the read/write circuitry 106, that is associated with operation of the memory cells, as an illustrative, non-limiting example.

The non-volatile memory 104 may include one or more physical pages of storage elements (e.g., word lines of storage elements). For example, FIG. 1 indicates that the non-volatile memory 104 includes physical pages 108, 116, and 124. The physical pages 108, 116 may be adjacent to each other. The physical pages 108, 116, and 124 may be included in a particular block (e.g., erase group) of the non-volatile memory 104. The non-volatile memory 104 may include multiple blocks of physical pages. Although FIG. 1 depicts that the non-volatile memory 104 includes three physical pages (i.e., the physical pages 108, 116, and 124), it should be appreciated that depending on the particular implementation, the non-volatile memory 104 may include multiple blocks, each block including multiple physical pages. Further, although FIG. 1 depicts three physical pages, it should be appreciated that the non-volatile memory 104 may include another number of physical pages (i.e., less than three pages or more than three pages).

The physical pages 108, 116, and 124 may each store data, such as one or more logical pages. To illustrate, one or more of the physical pages 108, 116, 124 may correspond to a physical page of single-level cell (SLC) storage elements that can be programmed by the controller 130 to store threshold voltages indicating a bit value of a logical page, such as in connection with a one-bit-per-cell ("X1") configuration. One or more of the physical pages 108, 116, 124 may correspond to a physical page of multi-level cell (MLC) storage elements that can be programmed by the controller 130 to store threshold voltages indicating bit values of multiple logical pages, such as in connection with a two-bit-per-cell ("X2") configuration or a three-bit-per-cell ("X3") configuration, as illustrative examples.

The controller 130 may include an error correcting code (ECC) engine 132, a random access memory (RAM) 138, a page combiner 146, and a host interface 148. The ECC engine 132 may include an encoder 134 and a decoder 136. The page combiner 146 is configured to combine multiple inputs having different reliabilities in order to generate a combined input to the decoder 136.

The controller 130 is configured to receive data and instructions from the host device 154 via the host interface 148 and to send data to the host device 154 via the host interface 148. For example, the controller 130 may send data to the host device 154 via the host interface 148 and may receive data from the host device 154 via the host interface 148. The controller 130 may store (e.g., buffer) data at a cache or a memory, such as at the RAM 138.

The controller 130 is configured to send data and commands to the non-volatile memory 104 and to receive data from the non-volatile memory 104. For example, the controller 130 is configured to send data and a write command to cause the non-volatile memory 104 to store the data to a specified address of the non-volatile memory 104. The controller 130 is configured to send a read command to read data from a specified address of the non-volatile memory 104.

The host device 154 may correspond to a mobile telephone, a music player, a video player, a gaming device or console, an electronic book reader, a personal digital assistant (PDA), a computer, such as a laptop, a tablet, or a notebook computer, a portable navigation device, another electronic device, or a combination thereof. The host device 154 may communicate via a host controller, which may enable the host device 154 to communicate with the data storage device 102. The host device 154 may operate in compliance with a JEDEC Solid State Technology Association industry specification, such as an embedded MultiMedia Card (eMMC) specification or a Universal Flash Storage (UFS) Host Controller Interface specification. The host device 154 may operate in compliance with one or more other specifications, such as a Secure Digital (SD) Host Controller specification as an illustrative example. Alternatively, the host device 154 may communicate with the data storage device 102 in accordance with another communication protocol.

In operation, the controller 130 may receive data to be stored at the non-volatile memory 104. For example, the controller 130 may receive data from the host device 154 to be stored at the non-volatile memory 104. The data may correspond to data bits 112, 120 (e.g., user data). In response to receiving the data, the controller 130 may input the data to the ECC engine 132 to be encoded (e.g., to generate one or more ECC codewords).

The controller 130 may input the data bits 112, 120 to the ECC engine 132. The ECC engine 132 is configured to generate one or more ECC codewords based on the data bits 112, 120 using an ECC encoding technique. The encoder 134 may include a Reed-Solomon (RS) encoder, a Bose-Chaudhuri-Hocquenghem (BCH) encoder, a low-density parity check (LDPC) encoder, a turbo encoder, an encoder configured to encode data according to one or more other ECC techniques, or a combination thereof. The encoder 134 may encode the data bits 112 to generate a logical page 110 that includes the data bits 112 and ECC bits 114. The encoder 134 may encode the data bits 120 to generate a logical page 118 that includes the data bits 120 and ECC bits 122. In a particular embodiment, the ECC bits 114, 122 are generated according to a BCH encoding technique.

The data storage device 102 may generate a logical page 126 based on the logical pages 110, 118. To illustrate, the data storage device 102 may perform an exclusive-OR (XOR) operation using bits of the logical pages 110, 118 to generate parity bits 128. For example, the parity bits 128 may be generated by performing a bit-wise XOR operation between the logical pages 110, 118. Depending on the particular implementation, the non-volatile memory 104 or the controller 130 may be configured to generate the parity bits 128. As an example, the controller 130 may be configured to perform XOR operations to generate the parity bits 128. To illustrate, the ECC engine 132 may be configured to perform XOR operations to generate the parity bits 128. Alternatively or in addition, the read/write circuitry 106 may be configured to perform XOR operations to generate the parity bits 128. In this example, the non-volatile memory 104 may receive the logical pages 110, 118 after encoding by the encoder 134 and may XOR the logical pages 110, 118 to generate the parity bits 128. The parity bits 128 may be stored at the physical page 124 by writing data (e.g., by programming storage elements of the physical page 124), such as one or more logical pages that can be sensed using the read/write circuitry 106 (e.g., the logical page 126).

The non-volatile memory 104 may store the logical pages 110, 118, and 126 to the non-volatile memory 104, as illustrated in the example of FIG. 1. After storing the data bits 112 to the non-volatile memory 104, the controller 130 may access the data bits 112. For example, the controller 130 may receive a request 150 for read access to the data bits 112 from the host device 154. The request 150 may specify a logical address associated with the data bits 112. In response to receiving the request 150, the controller 130 may translate the logical address to a physical address of the physical page 108, such as via a file table (not shown in FIG. 1). The controller 130 may send a read command to the non-volatile memory 104. The read command may specify the physical address of the physical page 108.

In response to the read command, the read/write circuitry 106 may sense the physical page 108 to generate sensed data corresponding to the logical page 110, such as a sensed logical page 139. The non-volatile memory 104 may send the sensed logical page 139 to the controller 130. The sensed logical page 139 may include data bits corresponding to the data bits 112 and may further include ECC bits corresponding to the ECC bits 114.

The controller 130 may input the sensed logical page 139 to the decoder 136 to decode the sensed logical page 139. The decoder 136 may be configured to decode data read from the non-volatile memory 104 to detect and correct, up to an error correction capability of an ECC technique used by the ECC engine 132, bit errors that may be present in the read data. In the example of FIG. 1, the decoder 136 may use ECC bits of the sensed logical page 139 corresponding to the ECC bits 114 to decode data bits of the sensed logical page 139 corresponding to the data bits 112.

The sensed logical page 139 may include one or more bit errors, such as bit errors caused during writing of the logical page 110 (e.g., over-programming or under-programming), bit errors caused during storage of the logical page 110 (e.g., noise and cross coupling effects), and/or bit errors caused during reading of the logical page 110 (e.g., read errors). If a bit error rate (BER) of the sensed logical page 139 is within the error correction capability of the decoder 136 (based on the ECC technique or techniques used to encode the data bits 112), the decoder 136 may output decoded data corresponding to the data bits 112, and the controller 130 may provide the decoded data to the host device 154 via the host interface 148.

If the BER of the sensed logical page 139 exceeds the error correction capability of the decoder 136 (e.g., if the sensed logical page 139 is a "failed page"), the controller 130 may access the logical pages 118, 126 to generate a reconstructed logical page 140. To illustrate, the logical page 110 may be reconstructed using the parity bits 128 and the logical page 118, such as by performing a bit-wise XOR operation between the parity bits 128 and the logical page 118 to generate the reconstructed logical page 140. In a particular embodiment, the controller 130 accesses the logical page 118, decodes the logical page 118 using the ECC bits 122 to correct one or more bit errors that may be present in the data bits 120 to generate decoded data, and re-encodes the decoded data to generate a re-encoded logical page corresponding to the logical page 118. In this example, the logical page 110 may be reconstructed using the parity bits 128 and the re-encoded logical page, such as by performing a bit-wise XOR operation between the parity bits 128 and the re-encoded logical page to generate the reconstructed logical page 140. Decoding and re-encoding the logical page 118 may correct one or more bit errors in the logical page 118 and may increase the likelihood of the reconstructed logical page 140 having a BER within the error correction capability of the decoder 136.

If the BER of the reconstructed logical page 140 is within the error correction capability of the decoder 136, the decoder 136 may output decoded data corresponding to the data bits 112, and the controller 130 may provide the decoded data to the host device 154 via the host interface 148.

If the BER of the reconstructed logical page 140 exceeds the error correction capability of the decoder 136, then bits of the reconstructed logical page 140 may be unreliable. As a particular example, if multiple logical pages used to generate the parity bits 128 have high BERs, then using the parity bits 128 combined with one of the high BER logical pages may be unreliable (i.e., the controller 130 may be unable to perform XOR operations to recover logical pages using the parity bits 128). In this case, both the sensed logical page 139 and the reconstructed logical page 140 may have BERs that exceed the error correction capability associated with the ECC technique(s) used to encode the data bits 112, 120. Certain conventional devices may determine that an uncorrectable ECC (UECC) error associated with the logical page 110 has occurred in this circumstance, and data loss may occur.

Using a technique in accordance with the present disclosure, the data storage device 102 may utilize bits of both the sensed logical page 139 and the reconstructed logical page 140 to generate a combined logical page 144. As a particular example, the page combiner 146 may combine bits of the sensed logical page 139 and the reconstructed logical page 140 to generate data having a BER that is within the error correction capability of the decoder 136. In this example, although the sensed logical page 139 and the reconstructed logical page 140 may each individually have BERs exceeding the error correction capability due to large numbers of "incorrect" (e.g., corrupted) bits, the sensed logical page 139 and the reconstructed logical page 140 may collectively include a certain number of "correct" bits that can be combined to generate data having a BER that is within the error correction capability of the decoder 136.

The data storage device 102 may generate reliability information 142 to enable the page combiner 146 to combine the sensed logical page 139 and the reconstructed logical page 140. The reliability information 142 may indicate which bits of the sensed logical page 139 are likely to be correct (or incorrect). Alternatively or in addition, the reliability information 142 may indicate which bits of the reconstructed logical page 140 are likely to be correct (or incorrect). In at least one embodiment, the read/write circuitry 106 is configured to sense one or more physical pages of the non-volatile memory 104 using a "soft" read technique to generate the reliability information 142. The soft read technique may use multiple sense operations for each storage element of a target physical page to determine reliability of data stored at the target physical page.

To illustrate, if a storage element of the physical page 108 stores a threshold voltage that is approximately centered within a target threshold voltage distribution, the reliability information 142 may indicate that a bit value associated with the storage element is likely correct. If the storage element stores a threshold voltage that is outside a target threshold distribution (e.g., "between" two target threshold distributions), the reliability information 142 may indicate that a bit value associated with the storage element is uncertain or is likely incorrect. Example soft read techniques and other techniques for generating the reliability information 142 are described further with reference to FIG. 2.

Alternatively, or in addition to using a soft bit technique, the reliability information 142 may be determined based on threshold voltages of neighboring storage elements. For example, a storage element having a relatively low threshold voltage may experience a threshold shift due to a neighboring storage element being programmed to a relatively high threshold voltage. The controller 130 may cause one or more pages neighboring the physical page 108 to be read and may use the resulting data to generate the reliability information 142.

The page combiner 146 may combine the sensed logical page 139 and the reconstructed logical page 140 by substituting one or more bits of the reconstructed logical page 140 for one or more bits of the sensed logical page 139 indicated by the reliability information 142 as being unreliable. By replacing one or more unreliable bits of the sensed logical page 139 with one or more bits of the reconstructed logical page 140, the page combiner 146 may generate the combined logical page 144. The combined logical page 144 may have a higher reliability (e.g., a lower BER) than either the sensed logical page 139 or the reconstructed logical page 140.

The controller 130 may input the combined logical page 144 to the decoder 136. If the combined logical page 144 has a BER that is within the error correction capability of the decoder 136, the decoder 136 may generate decoded data corresponding to the data bits 112, such as recovered data 152 (e.g., user data). The controller 130 may provide the recovered data 152 to the host device 154 via the host interface 148 in response to decoding the combined logical page 144 and in response to receiving the request 150, as illustrated in the example of FIG. 1.

If the BER of the combined logical page 144 exceeds the error correction capability of the decoder 136, the data storage device 102 may continue to attempt to generate a logical page having a BER within the error correction capability of the decoder 136. For example, the data storage device 102 may re-sense the physical page 108 to generate second reliability information and/or a second sensed logical page. Alternatively or in addition, the data storage device 102 may send a message to the host device 154 indicating that the data bits 112 are unavailable.

It should be appreciated that the example of FIG. 1 is illustrative and that modifications of the examples presented herein are within the scope of the disclosure. To illustrate, depending on the particular application, one or both of the reconstructed logical page 140 or the combined logical page 144 may be generated automatically (e.g., without first determining a decoding failure). For example, multiple sources of data may automatically be accessed in response to the request 150, such as by automatically generating the sensed logical page 139, the reconstructed logical page 140, the reliability information 142, and the combined logical page 144 in response to receiving the request 150. In a particular example, the controller 130 generates the combined logical page 144 without attempting to decode one or both of the sensed logical page 139 or the reconstructed logical page 140. Such a technique may be beneficial when high error rates are expected at a data storage device, such as at the "end-of-life" (EOL) of a data storage device when device reliability is reduced. The technique may be beneficial in connection with lower error correction capabilities, such as in order to increase data throughput in a data storage device. In one or more other implementations, the reconstructed logical page 140 may be generated in response to a decoding failure associated with the sensed logical page 139, and/or the reliability information 142 and the combined logical page 144 may be generated in response to a decoding failure associated with the reconstructed logical page 140. Such a technique may be advantageous when low error rates are expected at a data storage device, such as at the beginning of use of a data storage device by an end user and/or in connection with greater error correction capabilities of a data storage device.

In an illustrative example, the controller 130 is configured to generate a reference page indicating bit differences between the sensed logical page 139 and the reconstructed logical page 140. The reference page may include a first set of first logical values (e.g., "0" bits) indicating that corresponding bits of the sensed logical page 139 are considered "unreliable" and may further include a second set of second logical values (e.g., "1" bits) indicating that corresponding bits of the sensed logical page 139 are considered "reliable," e.g., based on soft bit reads and/or neighboring storage elements, as illustrative examples. The reliability information 142 may correspond to the reference page. In an illustrative example, the controller 130 uses the reference page to generate the combined logical page 144. For example, the page combiner 146 may be configured to generate the combined logical page 144 according to P4=(P1 AND P3) OR (P2 AND (NOT P3)), where P1 indicates the sensed logical page 139, P2 indicates the reconstructed logical page 140, P3 indicates the reference page (which may correspond to the reliability information 142), and P4 indicates the combined logical page 144. It will be appreciated that the page combiner 146 may be implemented using a processor and/or controller that executes instructions (e.g., firmware) and/or using hardware, such as digital logic configured to perform logical operations (e.g., AND, OR, NOT, and/or XOR). In one embodiment, the page combiner 146 may be implemented within the non-volatile memory 104 and without dedicated hardware support in the controller 130. For example, the non-volatile memory 104 may be configured to perform logical operations at memory latches of the non-volatile memory 104. Such logical operations are usually supported in non-volatile memories, such as in connection with "in-memory" ECC operations and/or parity operations. In this example, the sensed logical page 139 (P1) may be read into a first latch (L1) of the non-volatile memory 104, and the reconstructed logical page 140 (P2) may be read into a second latch (L2) of the non-volatile memory 104. The reliability information 142 (P3) may be read into a third latch (L3) of the non-volatile memory 104 (e.g. via a soft bit reading technique, as described further with reference to FIG. 2). The combined logical page 144 (P4) may be produced by performing the following logical operation at the memory latches: (L1 AND L3) OR (L2 AND (NOT L3)). The combined logical page 144 (P4) may then transferred to the controller 130 for decoding.

The example of FIG. 1 illustrates that error correction of a data storage device may be improved by combining multiple inputs having different reliabilities in order to generate a combined input to a decoder of the data storage device. For example, the data storage device 102 of FIG. 1 may replace bits of the sensed logical page 139 with bits of the reconstructed logical page 140 to generate the combined logical page 144. The techniques described with reference to FIG. 1 may be used in connection with a "hard" decoder, which may simplify device complexity while also enabling high error correction associated with a "soft" decoder.

Figure 2:
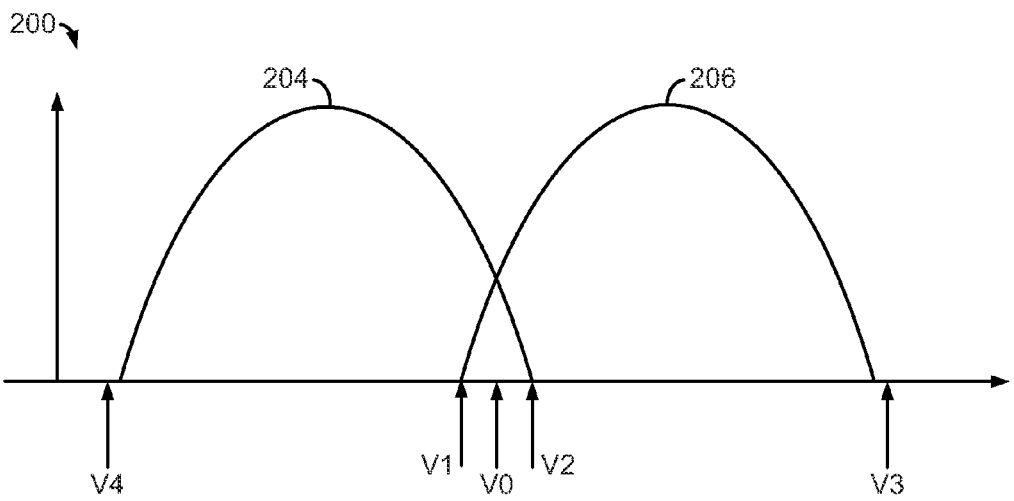
FIG. 2 illustrates a histogram, a data structure, and a process for combining logical pages in accordance with certain example features of the data storage device of FIG. 1.
Figure 2:
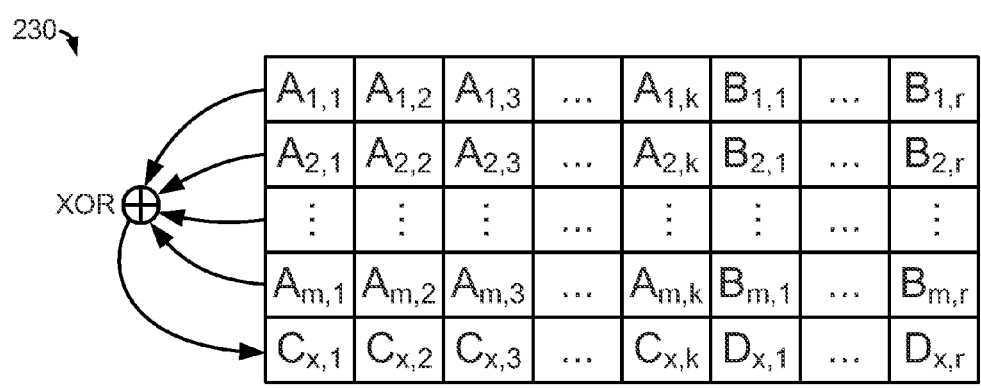
Figure 2:
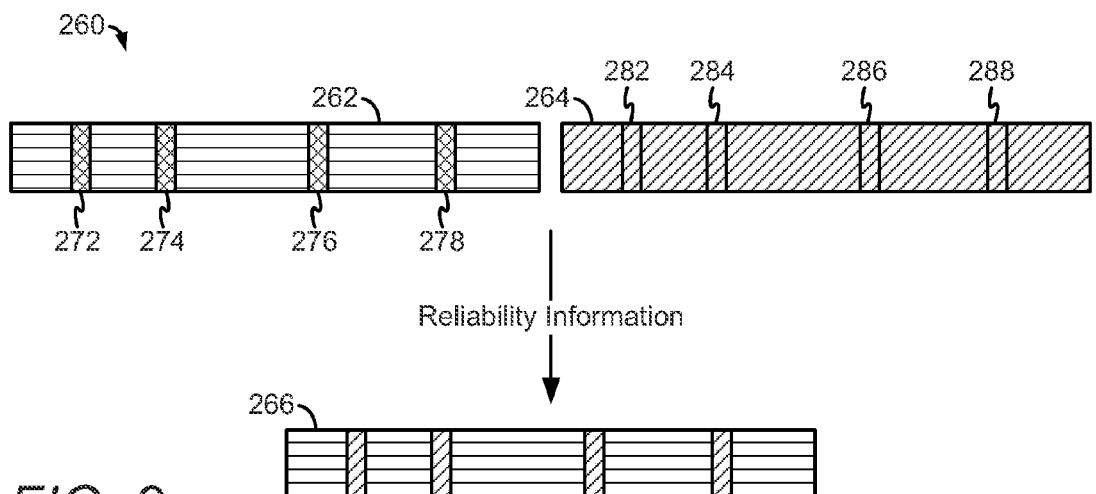

FIG. 2 illustrates a histogram 200, a data structure 230, and a process 260 for combining logical pages. In the histogram 200, the horizontal axis indicates threshold voltages, and the vertical axis indicates a number of storage elements (or a logarithm of a number of storage elements). To illustrate, the histogram 200 includes a distribution 204 and a distribution 206. The distribution 204 may indicate storage elements of a physical page of the non-volatile memory 104 programmed to a first logical value, and the distribution 206 may indicate storage elements of the physical page programmed to a second logical value. As a particular example, the histogram 200 may indicate a state of the physical page 108 upon programming the logical page 110. The distributions 204, 206 may correspond to states associated with a single-level cell (SLC) implementation of the physical page 108 (e.g., logical "0" and "1" states) or states associated with a multi-level cell (MLC)

configuration of the physical page 108 (e.g., "Er" and "A" states, "A" and "B" states, "B" and "C" states, etc.).

The data storage device 102 may sense the physical page 108 using a "hard" (or "low resolution") read to generate the sensed logical page 139. To illustrate, the read/write circuitry 106 may sense storage elements of the physical page 108 using a threshold voltage V0. In this example, the data storage device 102 may determine that storage elements of the physical page 108 having a threshold voltage less than V0 are programmed to a logical value associated with the distribution 204 and that storage elements of the physical page 108 having a threshold voltage greater than V0 are programmed to a logical value associated with the distribution 206. However, as illustrated in the example of FIG. 2, overlap between the distributions 204, 206 may cause one or more bit errors associated with the sensed logical page 139. If the number of bit errors exceeds the error correction capability of the decoder 136, a decoding error associated with the sensed logical page 139 may occur, as described with reference to FIG. 1.

The data storage device 102 may sense the physical page 108 using a "soft" (or "high resolution") read technique to generate the reliability information 142. For example, the read/write circuitry 106 may sense the physical page 108 at threshold voltages near the overlap region of the distributions 204, 206, such as at threshold voltages V1 and V2. If a first set of storage elements of the physical page 108 stores threshold voltages less than V1, the reliability information 142 may indicate that the first set of storage elements reliably store a first logical value associated with the distribution 204 (e.g., a logical "1" value). If a second set of storage elements of the physical page 108 stores threshold voltages greater than V2, the reliability information may 142 may indicate that the second set of storage elements reliably store a second logical value associated with the distribution 204 (e.g., a logical "0" value). If a third set of storage elements of the physical page 108 stores threshold voltages that are between V1 and V2 (e.g., V0), the reliability information 142 may indicate that the third set of storage elements is associated with unreliable values. The page combiner 146 may use the reliability information 142 to selectively replace bits of the sensed logical page 139 corresponding to the third set of storage elements with corresponding bits of the reconstructed logical page 140 to generate the combined logical page 144.

The read/write circuitry 106 may be configured to sense physical pages of the non-volatile memory 104 for over-programming of storage elements and/or program disturb effects at storage elements. To illustrate, the read/write circuitry 106 may sense the physical page 108 at a threshold voltage V3. If a fourth set of storage elements of the physical page 108 are programmed to a threshold voltage equal to or greater than V3, then over-programming may have occurred at the fourth set of storage elements while programming the logical page 110 and/or a program disturb effect may have occurred at the fourth set of storage elements after programming the logical page 110. For example, the fourth set of storage elements may have been targeted to be programmed to a threshold voltage within the distribution 204 but were read as being programmed to a threshold voltage of another distribution (e.g., the distribution 206) due to over-programming. In over-programming, one or more of the storage elements attached to a bit line may store a threshold voltage that exceeds a read voltage applied to non-selected storage elements during a read operation. As a result, all storage elements on the bit line may be read as being in the highest threshold voltage distribution (e.g., the distribution 206) regardless of actual threshold voltages stored by the storage elements. The reliability information 142 may indicate that the fourth set of storage elements is likely to store unreliable values. The page combiner 146 may use the reliability information 142 to selectively replace bits of the sensed logical page 139 corresponding to the fourth set of storage elements with corresponding bits of the reconstructed logical page 140 to generate the combined logical page 144.

The read/write circuitry 106 may be configured to sense physical pages of the non-volatile memory 104 for under-programming of storage elements. To illustrate, the read/write circuitry 106 may sense the physical page 108 at a threshold voltage V4. If a fifth set of storage elements of the physical page 108 are programmed to a threshold voltage equal to or less than V4, then under-programming may have occurred at the fifth set of storage elements while programming the logical page 110. For example, the fifth set of storage elements may have been targeted to be programmed to a threshold voltage within the distribution 206 but were read as being programmed to a threshold voltage of another distribution (e.g., the distribution 204) due to under-programming. The reliability information 142 may indicate that the fifth set of storage elements is likely to store unreliable values. The page combiner 146 may use the reliability information 142 to selectively replace bits of the sensed logical page 139 corresponding to the fifth set of storage elements with corresponding bits of the reconstructed logical page 140 to generate the combined logical page 144.

Alternatively or in addition, the reliability information 142 may be determined according to a "neighbor read" technique that senses a physical page of the non-volatile memory 104 that is adjacent to a target physical page of the memory. The neighbor read technique may sense physical pages and/or storage elements that are adjacent to target physical pages and/or target storage elements, respectively. To illustrate, the controller 130 may command the read/write circuitry 106 to sense the physical page 116. Because programming of the logical page 118 at the physical page 116 may cause program disturb effects at the physical page 108, sensing the physical page 116 may provide information regarding program disturb effects or over-programming effects at the physical page 108. For example, if the ith storage element of the physical page 116 has been over-programmed or under-programmed, then the ith storage element of the physical page 108 may be more likely to exhibit program disturb. As another example, if the (i−1)th storage element of the physical page 108 and/or (i+1)th storage element of the physical page 108 are over-programmed or under-programmed, then the ith storage element of the physical page 108 may be more likely to exhibit program disturb.

Alternatively or in addition, the reliability information 142 may be determined using an indication of a physical characteristic of the non-volatile memory 104. To illustrate, the data storage device 102 may have one or more defects, such as a defective word line or a defective column of storage elements. The one or more defects may occur during manufacturing of the data storage device 102, during testing of the data storage device 102, during operation of the data storage device 102, at another time, or a combination thereof. As a particular example, a "bad column" indicator may be stored at the data storage device 102 during testing of the data storage device 102. The bad column indicator may indicate a column of storage elements of the non-volatile memory 104 that is unreliable (e.g., has a physical defect). The column may be identified during testing of the data storage device 102, such as during a manufacturing test or during a self-test operation, as illustrative examples. In certain configurations, the identified column may be remapped to another column of the non-volatile memory 104, such as to a "redundant" column. If a storage element of the physical page 108 is included in the column, the reliability information 142 may indicate that a threshold voltage stored by the storage element is unreliable.

Alternatively or in addition, the logical page 110 may be programmed using a shaping technique that assigns a first probability to a first logical value and a second probability to a second logical value. The reliability information 142 may be determined in accordance with the shaping technique. For example, different error probabilities may be associated with the distributions 204, 206, such as by encoding the logical page 110 using an encoding technique that programs storage elements of the physical page 108 to a threshold voltage within the distribution 204 more frequently than within the distribution 206 (or vice versa). If storage elements of the physical page 108 are programmed more frequently to the distribution 204, then a particular storage element of the physical page 108 sensed as storing a threshold voltage within the distribution 204 is more likely to be "correct" than if the storage element is sensed as storing a threshold voltage within the distribution 206. In this example, the page combiner 146 may replace one or more bit values of the sensed logical page 139 associated with the distribution 206 with corresponding bit values from the reconstructed logical page 140.

The data structure 230 illustrates information that can be stored at the non-volatile memory 104. For example, the non-volatile memory 104 may store threshold voltages indicating data bits (A), ECC bits (B), and parity bits (C and D). In the data structure 230, k indicates a number of data bits A in each row of the data structure 230, r indicates a number of ECC bits B in each row of the data structure 230, m indicates a number of data bits A or ECC bits B in each column of the data structure 230, and x indicates a number of rows of parity bits in the data structure 230 (i.e., x=1 in the example of FIG. 2).

In the data structure 230, each row of data bits (A) may be encoded via a first code (e.g., a BCH code) to generate the ECC bits (B). Each column of data bits may be encoded according to a second code that may be different than the first code. For example, each column of data bits may be encoded according to a XOR operation to generate the parity bits (C and D). That is, each parity bit C and D may be generated via a XOR operation that uses each data bit or ECC bit in a particular column of the data structure 230. For example, the parity bit Cx,1 may be generated according to $Cx,1 = A1,1 \oplus A2,1 \oplus \ldots \oplus Am,1$ (where m is an integer greater than two). As another example, the parity bit Dx,r may be generated according to $Dx,r = B1,r \oplus B2,r \oplus \ldots \oplus Bm,r$.

In FIG. 2, each row of the data structure 230 may correspond to a logical page stored at the non-volatile memory 104. For example, the first row of the data structure 230 may correspond to the logical page 110, the data bits A1,1 ... A1,k may correspond to the data bits 112, and the ECC bits B1,1 ... B1,r may correspond to the ECC bits 114. As another example, the second row of the data structure 230 may correspond to the logical page 118, the data bits A2,1 ... A2,k may correspond to the data bits 120, and the ECC bits B2,1 ... B2,r may correspond to the ECC bits 114. The xth row of the data structure 230 may correspond to the logical page 126, and the parity bits Cx,1 ... Cx,k and Dx,1 ... Dx,r may correspond to the parity bits 128. In a particular embodiment, the data structure 230 corresponds to information stored at a block of the non-volatile memory 104.

An example technique in accordance with the present disclosure may use the parity bits Cx,1 ... Cx,k and Dx,1 ... Dx,r for error detection and further as "auxiliary" reliability information. For example, if the data bit A1,1 is read from the non-volatile memory 104 with low reliability, the data bit A1,1 may be reconstructed using other bits in the first column of the data structure 230, such as according to $A1,1 = Cx,1 \oplus A2,1 \oplus \ldots \oplus Am,1$. Further, a "bad row" of the data structure having a high error rate may be reconstructed by reconstructing each bit of the "bad row" using other bits of the data structure 230 to generate a set of reconstructed bits. In this example, the "bad row" may correspond to the sensed logical page 139, and the reconstructed data may correspond to the reconstructed logical page 140.

In a particular embodiment, reliability of a reconstructed bit may be computed as a function of individual reliabilities of constituent bits used to reconstruct the bit. If the reliability of the reconstructed bit is higher than the reliability of the (original) bit, the reliability information 142 may indicate that the bit value having the higher reliability is the "correct" bit. To further illustrate, if the constituent reliabilities of the data bits $Cx,1 \oplus A2,1 \oplus \ldots Am,1$ are higher than the reliability of the data bit A1,1, then the controller 130 may determine that the "correct" value of A1,1 is $A1,1 = Cx,1 \oplus A2,1 \oplus \ldots Am,1$. In this example, the controller 130 may be configured to selectively provide bit values to the decoder 136 having higher reliabilities. The reliabilities may be computed using one or more techniques described herein and may be indicated by the reliability information 142. In a particular embodiment, the reliability information 142 indicates a population of reliable values (e.g., a "green" population) and further indicates a population of unreliable values (e.g., a "red" population). In a particular embodiment, the decoder 136 includes a BCH "row" decoder that is configured to decode rows of the data structure 230. Alternatively or in addition, the decoder 136 may include another decoder, such as a "soft" decoder that is responsive to soft bits.

The data structure 230 of FIG. 2 illustrates that the parity bits 128 may be generated by performing XOR operations using bits from logical pages stored at the non-volatile memory 104. The data storage device 102 of FIG. 1 may generate the parity bits 128 by performing a one-dimensional (1D) XOR operation in a first XOR "direction," such as a column-wise XOR operation down columns of the data structure 230. In this example, each parity bit C is generated based on data bits A of a column, and each parity bit D is generated based on ECC bits B of a column. Alternatively or in addition, the parity bits 128 may include parity bits that are generated using a two-dimensional (2D) XOR operation that utilizes multiple XOR "directions," such as a diagonal XOR operation across rows and columns of the data structure 230.

The process 260 illustrates an example technique for combining a logical page 262 and a logical page 264 to generate a logical page 266. The logical page 262 may correspond to the sensed logical page 139, and the logical page 264 may correspond to the reconstructed logical page 140. The logical page 266 may correspond to the combined logical page 144.

In the example of FIG. 2, the logical page 262 includes unreliable bits 272, 274, 276, and 278. The data storage device 102 may determine unreliability of the unreliable bits 272, 274, 276, and 278 in accordance with a technique that may include one or more of the sample techniques described with reference to the histogram 200. In response to identifying the unreliable bits 272, 274, 276, and 278, the data storage device 102 may combine the logical pages 262, 264 to generate the logical page 266. For example, the page combiner 146 may replace the unreliable bits 272, 274, 276, and 278 with corresponding bits 282, 284, 286, and 288 from the logical page 264 to generate the logical page 266.

The logical page 266 may have a BER that is within the error correction capability of the decoder 136. In this case, the decoder 136 may decode the logical page 266 to generate recovered data. The recovered data may correspond to the recovered data 152.

The examples of FIG. 2 illustrate data recovery techniques that are compatible with both hard decoders and soft decoders. The data recovery techniques enable high error correction capability of a decoder while reducing device complexity. For example, because the data recovery techniques are compatible with a hard decoder that accepts only "hard" bits (logical "1" bits and logical "0" bits), a complexity of the hard decoder may be reduced (e.g., as compared to a soft decoder that is configured to accept soft bits) while also enabling high error correction capability of the decoder (e.g., to within an error correction capability range associated with soft decoders).

Figure 3:
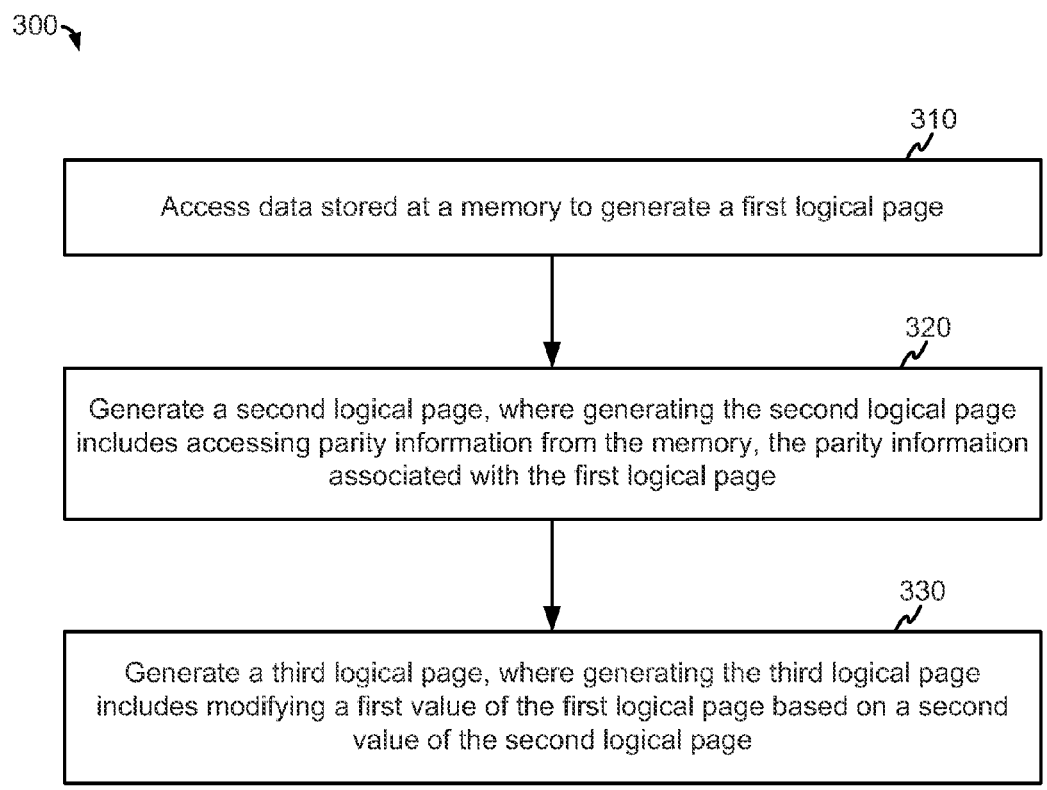
FIG. 3 is a flow diagram that illustrates a particular illustrative embodiment of a method of operating the data storage device of FIG. 1.

Referring to FIG. 3, a particular illustrative embodiment of a method is depicted and generally designated 300. The method 300 may be performed by the data storage device 102, such as by the controller 130 and/or by the non-volatile memory 104.

The method 300 may include accessing data stored at a memory to generate a first logical page, at 310. The memory may correspond to the non-volatile memory 104, the first logical page may correspond to the logical page 110, and the data may correspond to threshold voltage levels stored at the physical page 108 indicating the logical page 110. Accessing the data may include sensing the physical page 108 to generate the sensed logical page 139.

The method 300 further includes generating a second logical page, at 320. The second logical page may correspond to the reconstructed logical page 140. Generating the second logical page includes accessing parity information from the memory. The parity information is associated with (e.g., is generated using) the first logical page. The parity information may correspond to the parity bits 128. The second logical page may be generated by performing a XOR operation with respect to the parity information and at least one other logical page stored at the memory, such as the logical page 118. In a particular illustrative embodiment, the parity information is generated (prior to accessing the parity information) by performing an exclusive-or (XOR) operation with respect to the first logical page and at least one other logical page, such as the logical page 118. After generating the parity information, the parity information may be stored to the memory to be accessed during one or more read operations.

The method 300 further includes generating a third logical page, at 330. Generating the third logical page includes modifying a first value of the first logical page based on a second value of the second logical page. The third logical page may correspond to the combined logical page 144. The first value may be modified based on reliability information, which may indicate that the first value has a low reliability, that the second value has a high reliability, and/or that the second value has a higher reliability than the first value. The reliability information may correspond to the reliability information 142.

To illustrate, the first value and the second value may correspond to soft bits, and modifying the first value may correspond to a "soft combining" of the first value and the second value. In this case, modifying the first value based on the second value may generate a third (soft) value that is more reliable than the first value, and the third page may include the third value. The reliability information may be associated with the first logical page (e.g., may indicate reliabilities of values of the first logical page), and the first value may be modified in response to the reliability information indicating that the first value has low reliability. Alternatively or in addition, the reliability information may be associated with the second logical page (e.g., may indicate reliabilities of values of the second logical page), and the first value may be modified in response to the reliability information indicating that the second value has high reliability. In an illustrative example, the third logical page includes log-likelihood ratio (LLR) values, and modifying the first value includes summing a first LLR value corresponding to the first value with a second LLR value corresponding to the second value.

In another example, the third logical page may correspond to a binary page of hard bits, and the first value and the second value may correspond to hard bits. In this case, modifying the first value may include replacing the first value with the second value, and the third page may include the second value (in place of the first value). The reliability information may be associated with the first logical page (e.g., may indicate reliabilities of values of the first logical page), and the first value may be replaced with the second value in response to the reliability information indicating that the first value has low reliability. Alternatively or in addition, the reliability information may be associated with the second logical page (e.g., may indicate reliabilities of values of the second logical page), and the first value may be replaced with the second value in response to the reliability information indicating that the second value has high reliability.

Optionally, the method 300 may include one or more other operations that may be performed by the data storage device 102, such as by the controller 130. For example, the method 300 may include determining a decoding failure. To illustrate, in the method 300, the second logical page may be generated in response to detecting a decoding failure associated with the first logical page. Alternatively or in addition, the third logical page may be generated in response to detecting a decoding failure associated with the second logical page. In one or more other implementations, the second logical page and/or the third logical page may be generated "automatically" (e.g., without attempting to decode the first logical page and/or the second logical page).

The method 300 may optionally include decoding the third logical page to generate user data, which may correspond to the recovered data 152. The third logical page may be decoded by a decoder, such as the decoder 136. In an illustrative implementation, the first value and the second value are soft values, and the decoder is a soft-input decoder. In another example, the first value and the second value are hard bits, and the decoder is a hard-input decoder. The decoder may be a Bose-Chaudhuri-Hocquenghem (BCH) decoder.

The method 300 of FIG. 3 enables use of reliability information in a data storage device without requiring a soft decoder. To illustrate, certain devices may increase error correction capability using a soft decoding technique. The method 300 of FIG. 3 illustrates reliability-based techniques that can be used in connection with a hard decoder that does not accept soft bit information as an input. Further, the method 300 illustrates a technique that may be applied "as needed" (e.g., in response to a decoding failure) as compared to a soft decoding technique that may be applied over the lifetime of a device and that may be associated with increased device complexity (e.g., an increased number of decoder inputs to accept soft bits).

To further illustrate, in a non-limiting example, the physical page 108 may include a percentage $a$ of storage elements storing values associated with a high bit error rate (p_high) and may further include a percentage ($\alpha-1$) of storage elements storing values associated with a low bit error rate (p_low). A bit error rate of the reconstructed logical page 140 may correspond to BER_XOR, where $BER\_XOR = 0.5 \cdot (1 - (1 - 2 \cdot BER)^k)$ (e.g., approximately k·BER). The parameter BER may indicate a bit error rate of the sensed logical page 139. The parameter k may indicate a multi-dimension XOR parameter indicating a number of XOR "dimensions" used to generate the parity bits 128, such as a number of failing pages within a XOR dimension of the multiple XOR dimensions having the least number of failing pages of the multiple XOR dimensions. As an example, in a 2D XOR scheme, if the first XOR dimension has a number f of failed pages and the second XOR dimension has a number f+1 of failed pages, then k=f. By using the reliability information 142 to combine bits of the sensed logical page 139 and the reconstructed logical page 140, a bit error rate of the combined logical page 144 may correspond to BER_co, where BER_co=α·BER_XOR+(1−α)·p_low and BER_co<BER.

In an illustrative numerical example, plow corresponds to a 0.25% bit error rate, p_high corresponds to a 40% bit error rate, and α=0.01. In this example, BER=α·p_high+(1−α)·p_low=0.01·0.4+0.99·0.0025≈0.7%. In certain implementations, a 48 bit/512 byte BCH code has a length of 512 bytes and an error correction capability of up to 48 bits. The 48 bit/512 byte BCH code may have approximately a 0.54% probability of failing to successfully decode the sensed logical page 139 when the sensed logical page 139 has the error rate of 0.7%. The reconstructed logical page 140 may have approximately an 8.5% probability of failing decoding if the parity bits 128 are based on 64 logical pages in accordance with a 2D XOR technique. In this example, by selectively combining bits of the sensed logical page 139 and the reconstructed logical page 140, BER_co=α·BER_XOR+(1−α) p_low=0.01·(0.007)−3+0.99·(0.0025)−3=0.2545%. In an implementation using a 48 bit/512 byte BCH technique, the probability of a decoding failure is reduced using the combined logical page 144 (e.g., to a probability on the order of 10^(−15) or less).

A particular illustrative single-level cell (SLC) example may utilize a Gaussian noise model and reliability information corresponding to one soft bit per hard bit of data. In this example, we arbitrarily assume that we use voltage levels 0v and 1v in the floating gate for storing states '0' and state '1', respectively. To these programmed states an additive Gaussian noise with zero mean and standard deviation σ may be added. In this case, the hard bit (HB) "Maximum-Likelihood" (ML) decision threshold (to reduce the bit-error-rate in detecting the stored value in the cell) is 0.5v. Furthermore, we also have soft bit (SB) thresholds placed in 0.5v+Δ and 0.5v−Δ, where Δ is a parameter selected to reduce the block error rate (BLER) of the combined scheme (see BLER_co below). Furthermore, in this example, n indicates a BCH code length (e.g., 512 bytes), t indicates a BCH correction capability (e.g., 48 bits), and N_i indicates a number of logical pages in an ith XOR dimension of a 2D XOR (e.g., N_1=64 and N_2=32). In this illustrative example, BER=α·p_high+(1−α)·p_low=Q (1/(2σ)), where σ indicates the standard deviation of the Gaussian noise model. For example, σ may indicate a standard deviation of a lobe of a cell voltage distribution (CVD) model, where σ=1/(2·Q^−1(BER)) and $$Q(x) = \int_x^\infty \frac{1}{\sqrt{2\pi}} e^{-v^2/2} dv.$$

The CVD model may include data corresponding to the distributions 204, 206 (e.g., data corresponding to the histogram 200). In this example in order to determine the probability for the low reliability region (denoted as α) the following formula is used $$\alpha = Q\left(\frac{0.5-\Delta}{\sigma}\right) - Q\left(\frac{0.5+\Delta}{\sigma}\right).$$

The probability for bit flip given that we are at the low reliability region is $$p\_high = \frac{Q\left(\frac{0.5}{\sigma}\right) - Q\left(\frac{0.5+\Delta}{\sigma}\right)}{\alpha}$$

The probability for bit flip given that we are at the high reliability region is $$p\_low = \frac{Q\left(\frac{0.5+\Delta}{\sigma}\right)}{1-\alpha}$$

The probability for BCH failing in decode operation may be the probability for having more than t errors in the BCH block. According to the binomial distribution this is translated to $$BLER\_BCH = \sum_{j=t+1}^{n} \binom{n}{j} \cdot BER^j \cdot (1-BER)^{n-j}$$

Assuming that k is the number of extra failing pages in the XOR dimension with the "minimal" number of failing pages, the probability of error in 'XOR' reconstruction is:

$$BER\_2DXOR(k) = \frac{1-(1-2 \cdot BER)^k}{2}$$

The input BER that the BCH decoder receives after the XOR reconstruction is therefore:

BER_combined(k,Δ)=α·BER_2DXOR(k)+(1−α)·p_low

As a result, the BLER that this coding system achieves in this particular example can be derived by selecting Δ:

$$BLER_{co} = \min_\Delta \left\{ BLER_{BCH} \cdot \sum_{k=1}^{min\{N_1,N_2\}} P(k) \cdot \sum_{j=t+1}^n \binom{n}{j} \cdot BER_{co(k,\Delta)}^j \cdot (1-BER\_co(k,\Delta))^{n-j} \right\}$$

where P(k) may indicate the probability that the minimum number of BCH decoding failures (the minimum is taken over the two 2D-XOR dimensions) is k.

$$P(k) = \left[ A_1(k) \cdot \sum_{j=k+1}^{N_2} A_2(j) + A_2(k) \cdot \sum_{j=k+1}^{N_1} A_1(j) + A_1(k) \cdot A_2(k) \right]$$

where $$A_i(j) = \binom{N_i}{j} \cdot BLER\_BCH^j \cdot (1-BLER\_BCH)^{N_i-j}$$

In this example, BLER_BCH and BLER_co may indicate block error rates associated with a block of the non-volatile memory 104 that includes data used to generate the 2D XOR information. The 2D XOR information may correspond to the parity bits 128. The block may include a number of physical pages (e.g., 64 physical pages), which may include the physical pages 108, 116, and 124. The parameter A may indicate a difference between a "hard" read threshold voltage and a "soft" read threshold voltage. Referring again to FIG. 2, in an illustrative example, $\Delta = V0-V1 = V2-V0$. The parameters x, t, v, n, and/or j may correspond to parameters that may depend on the particular implementation and/or "dummy" variables.

Although certain examples herein are described in terms of a single-level cell (SLC) implementation for convenience of description, it will be appreciated that techniques described herein may be applicable to multi-level cell (MLC) configurations of a memory, such as the non-volatile memory 104. As an example, the distributions 204, 206 of FIG. 2 may correspond to a first logical page (e.g., an upper page) of data that further includes a second logical page (e.g., a lower page).

Although certain decoding operations herein are described in terms of a "hard" decoder that accepts hard bits, it should be appreciated that techniques described herein may be applied to a "soft" decoder that accepts soft information, such as log-likelihood ratio (LLR) information. In this example, the page combining may include "soft" combining based on the reliability information rather than a "hard" selection of the sensed page bit or the reconstructed page bit based on the reliability information. Such soft combining may be performed by summing the LLRs of the different sources (e.g., the sensed page source and one or more reconstructed page sources). For each bit i of the sensed logical page 139, the controller 130 may compute an LLR based on the sensed threshold voltage of a storage element of the physical page 108 storing the bit i. For each bit i of the reconstructed logical page 140, the controller 130 may compute an LLR by applying a "soft XOR" operation on the LLRs of bits i of each logical page participating in the XOR group and bit i of the logical page 126 including the parity bits 128. In an illustrative example, the "soft" XOR of bit i participating in a XOR group of $N_1$ pages is given by $\phi^{-1}(\Sigma_{j=1}^{N1} \phi(LRR_{ji}))$, where $\phi(x) = \{sign(x), -\log(\tan h(x/2))\}$, where $LLR_{ji}$ is the LLR of bit i in the jth page participating in the XOR group, and where one of the $N_1$ pages is the logical page 126 including the parity bits 128. In a particular example using two XOR dimensions (or groups), an ith LLR (LLR_i) of the combined logical page 144 may be computed based on:

$$LLR_i = \log\frac{1-p_i}{p_i} + \varphi^{-1}\left(\sum_{j=1}^{N_1}\varphi\left(\log\frac{1-p_{ji}}{p_{ji}}\right)\right) + \varphi^{-1}\left(\sum_{l=1}^{N_2}\varphi\left(\log\frac{1-p_{li}}{p_{li}}\right)\right)$$

In this example, p_i indicates a probability of bit i of the sensed logical page 139 being a "0" bit, p_ji indicates a probability of bit i in the jth logical page participating in a first XOR group having $N_1$ pages being a "0" bit, and p_li indicates a probability of bit i in the lth logical page participating in a second XOR group having $N_2$ pages being a "0" bit. The probabilities may be determined using a soft read technique and/or using a neighbor read technique. The LLRs may be input to a decoder, such as the decoder 136, to initiate a decoding operation.

If the decoding operation succeeds, the decoder 136 may output decoded data. The controller 130 may provide the decoded data to the host device 154. The decoded data may correspond to the recovered data 152. If the decoding operation fails, the controller 130 may reattempt the decoding operation by correcting one or more logical pages included in the 2D XOR group and re-computing the LLRs.

In a particular embodiment, data stored at a "bad column" of the non-volatile memory 104 may be error-corrected using parity information, such as the parity bits 128. To illustrate, a column of storage elements of the non-volatile memory 104 may have a defect that can corrupt data of one or more storage elements of the column. Certain devices may remap the column to a "redundant" column of storage elements to improve data integrity and reduce data errors associated with storing data at the bad column. An example technique in accordance with the present disclosure corrects data stored at the bad column using one or more techniques described herein, such as by XOR recovery using the parity bits 128 and/or using data combining by the page combiner 146. In a particular embodiment, such techniques are used instead of remapping the bad column to the redundant column. In this example, the redundant column may instead be used to store other data, such as additional parity bits.

The controller 130 may be configured to identify rates at which "0" bit values and "1" bit values are input to the decoder 136. If one bit value is input to the decoder 136 more often than the other bit value, the reliability information 142 may indicate that one bit value is more reliable than the other. To illustrate, if "1" bit values are input to the decoder 136 significantly more often than "0" bit values, the reliability information 142 may indicate that a "0" bit value of the sensed logical page 139 should be replaced using the corresponding bit of the reconstructed logical page 140. If p__0 indicates the probability of writing a "0" bit value and BER indicates a channel error probability, then:

$$\frac{A = pr\{1 \text{ was written} \mid 0 \text{ was received}\}}{B = pr\{0 \text{ was written} \mid 0 \text{ was received}\}} = \frac{BER(1-p_0)}{(1-BER)p_0}$$

For highly shaped data (e.g., where a number of "1" bit values is much greater than a number of "0" bit values, or vice versa), a corresponding value of BER may result in A/B≈1, so that log(A/B)≈0. In this example, a "0" bit value may be associated with a low reliability (e.g., may have a 50% chance of being incorrect). In this case, the parity bits 128 may be used to replace one or more "0" bit values. For example, referring again to the data structure 230, the data bit A1,1 may be replaced according to a XOR estimate:

$$\Sigma_{i=2}^{m} A_{i,1} + A_{xor,1}$$

In this example, the XOR estimate may be unreliable if one or more data bits Ai,1 for i=2, ..., m is an unreliable bit (e.g., is a "0" bit in this example). In such a case, the XOR estimate may be no more reliable than sensing the data bit A1,1. In this example, the XOR estimate may be used to replace A1,1 only if Ai,1 for i=2, ..., m is a reliable bit (e.g., is a "1" bit in this example) and if Axor,1=m mod(2). Otherwise, if Axor, 1≠mmod(2), then either A1,1 has a "correct" value of "0" (and does not need to be replaced) or at least one of Ai,1 for i=2, ..., m is an unreliable bit (e.g., is a "0" bit in this example). In the latter case, the XOR estimate may not be more reliable than the sensed value of A1,1.

As used herein, reliability of a value may be "low" or "high" relative to one or more thresholds. For example, reliability may be low if the reliability fails to satisfy a first reliability threshold, and reliability may be high if the reliability satisfies a second reliability threshold. Alternatively or in addition, reliabilities may be "low" or "high" relative to a common reliability threshold. In another example, a first reliability is low and a second reliability is high if the first reliability is less than the second reliability (and vice versa). A non-limiting illustrative example of a reliability is an LLR value. Alternatively or in addition, reliabilities may be determined using another technique.

Although one or more components described herein are illustrated as block components and described in general terms, such components may include one or more microprocessors, state machines, and/or other circuits configured to enable the data storage device 102 (or one or more components thereof) to perform operations described herein. One or more components illustrated herein may be coupled using one or more nodes, one or more buses (e.g., data buses and/or control buses), one or more other structures, or a combination thereof. The page combiner 146 may include one or more physical components, such as hardware controllers, state machines, logic circuits, one or more other structures, or a combination thereof, to enable the data storage device 102 to perform one or more operations described herein. One or more aspects of the data storage device 102 may be implemented using a microprocessor or microcontroller programmed (e.g., by executing instructions) to perform operations described herein, such as one or more operations of the method 300. In an illustrative implementation, the page combiner 146 may include a processor executing firmware. In a particular embodiment, the data storage device 102 includes a processor executing instructions (e.g., firmware) retrieved from the non-volatile memory 104. Alternatively or in addition, instructions that are executed by the processor may be retrieved from a separate memory location that is not part of the non-volatile memory 104, such as at a read-only memory (ROM). One or more operations described herein as being performed by the controller 130 may be performed at the non-volatile memory 104 (e.g., "in-memory" ECC decoding and/or in-memory XOR operations, as illustrative examples) alternatively or in addition to performing such operations at the controller 130.

To further illustrate, the controller 130 may include a processor that is configured to execute instructions to perform certain operations (e.g., an algorithm) described herein. The instructions may include general purpose instructions, and the processor may include a general purpose execution unit operable to execute the instructions. The processor may access the instructions from the non-volatile memory 104, the RAM 138, another memory location, or a combination thereof. The processor may execute the instructions to access data stored at a memory (e.g., the non-volatile memory 104). For example, the processor may execute the instructions to cause the controller 130 to send a read command to the non-volatile memory 104 to access the data. The data indicates a first logical page, such as the logical page 110. The processor may execute the instructions to generate a second logical page. Generating the second logical page may include accessing parity information from the memory associated with the first logical page. For example, the processor may execute the instructions to perform one or more XOR operations to generate the second logical page. The second logical page may correspond to the reconstructed logical page 140, and the parity information may correspond to the parity bits 128. The processor may execute the instructions to generate, based on reliability information associated with the first logical page, a third logical page by replacing at least a first bit value of the first logical page with a second bit value of the second logical page. The third logical page may correspond to the combined logical page 144. In a particular embodiment, the processor executes the instructions to generate the third logical page by computing P4=(P1 AND P3) OR (P2 AND (NOT P3)), where P1 indicates the first logical page, P2 indicates the second logical page, P3 indicates the reliability information, and P4 indicates the third logical page.

The data storage device 102 may be attached to or embedded within one or more host devices, such as within a housing of a host communication device (e.g., the host device 154). For example, the data storage device 102 may be integrated within a packaged apparatus such as a mobile telephone, a music player, a video player, a gaming device or console, an electronic book reader, a personal digital assistant (PDA), a computer, such as a laptop, a tablet, or a notebook computer, a portable navigation device, or other device that uses internal non-volatile memory. However, in other embodiments, the data storage device 102 may be implemented in a portable device configured to be selectively coupled to one or more external devices, such as the host device 154.

To further illustrate, the data storage device 102 may be configured to be coupled to the host device 154 as embedded memory, such as in connection with an embedded MultiMedia Card (eMMC®) (trademark of JEDEC Solid State Technology Association, Arlington, Va.) configuration, as an illustrative example. The data storage device 102 may correspond to an eMMC device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The non-volatile memory 104 may include a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, or another flash memory), an erasable programmable read-only memory (EPROM), an electrically-erasable programmable read-only memory (EEPROM), a read-only memory (ROM), a one-time programmable memory (OTP), a resistive random access memory (ReRAM), or a combination thereof. Alternatively or in addition, the non-volatile memory 104 may include another type of memory. The non-volatile memory 104 may include a semiconductor memory device.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art. The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
in a data storage device that includes a controller and a memory coupled to the controller, performing by the controller:
accessing data stored at the memory to generate a first logical page;
generating a second logical page, wherein generating the second logical page includes accessing parity information from the memory, the parity information associated with the first logical page; and
generating a third logical page, wherein generating the third logical page includes modifying a first value of the first logical page based on a second value of the second logical page.

2. The method of claim 1, wherein the first value is modified based on reliability information associated with the first logical page.

3. The method of claim 1, wherein the first value is modified based on reliability information associated with the second logical page.

4. The method of claim 1, wherein the third logical page is a binary page of hard bits, and wherein modifying the first value includes replacing the first value with the second value.

5. The method of claim 4, wherein the first value is replaced with the second value in response to reliability information associated with the first logical page indicating that the first value has low reliability.

6. The method of claim 4, wherein the first value is replaced with the second value in response to reliability information associated with the second logical page indicating that the first value has low reliability.

7. The method of claim 1, wherein the third logical page includes log-likelihood ratio (LLR) values, and wherein modifying the first value includes summing a first LLR value corresponding to the first value with a second LLR value corresponding to the second value.

8. The method of claim 1, wherein the second logical page is a reconstructed version of the first logical page that is generated using the parity information.

9. The method of claim 8, wherein the second logical page is generated by performing an exclusive-or (XOR) operation with respect to the parity information and at least one other logical page stored at the memory.

10. The method of claim 8, wherein the second logical page is generated in response to a first decoding failure associated with the first page.

11. The method of claim 10, wherein the third logical page is generated in response to a second decoding failure associated with the second page, and further comprising decoding the third logical page to generate user data.

12. The method of claim 1, wherein the third logical page is generated without attempting to decode one or both of the first logical page or the second logical page.

13. The method of claim 1, further comprising, prior to accessing the parity information, generating the parity information by performing an exclusive-or (XOR) operation with respect to the first logical page and at least one other logical page stored at the memory.

14. The method of claim 13, wherein the first logical page and the at least one other logical page each include data bits and error correcting code (ECC) bits.

15. The method of claim 1, wherein the first value is modified in response to reliability information indicating that the second value is more reliable than the first value.

16. The method of claim 15, further comprising generating a reference page including a first set of first logical values indicating that corresponding values of the first logical page are unreliable and further including a second set of second logical values indicating that corresponding values of the first logical page are reliable, wherein the reliability information corresponds to the reference page.

17. The method of claim 15, further comprising generating the reliability information using a soft read technique that senses a physical page to generate the first logical page.

18. The method of claim 15, further comprising generating the reliability information using a neighbor read technique that senses a physical page of the memory, wherein the physical page is adjacent to a target physical page of the memory, the target physical page storing the data.

19. The method of claim 15, further comprising generating the reliability information using a bad column indicator that indicates unreliability of a column of the memory.

20. The method of claim 15, further comprising generating the reliability information using a shaping technique that assigns a first probability to a first logical value and a second probability to a second logical value.

21. The method of claim 1, wherein the memory is a non-volatile memory having a three-dimensional (3D) memory configuration that is monolithically formed in one or more physical levels of arrays of memory cells having an active area disposed above a silicon substrate, and wherein the data storage device includes circuitry associated with operation of the memory cells.

22. A data storage device comprising:
a memory; and
a controller, wherein the controller is coupled to the memory, wherein the controller is configured to access a first logical page stored at the memory and to generate a second logical page, wherein generating the second logical page includes accessing parity information from the memory, the parity information associated with the first logical page, and wherein the controller is further configured to generate a third logical page, wherein generating the third logical page includes modifying a first value of the first logical page based on a second value of the second logical page.

23. The data storage device of claim 22, further comprising a decoder, wherein the decoder is configured to decode the third logical page in response to a decoding failure of at least one of the first logical page or the second logical page.

24. The data storage device of claim 23, wherein the first value and the second value are soft values, and wherein the decoder is a soft-input decoder.

25. The data storage device of claim 23, wherein the first value and the second value are hard bits, and wherein the decoder is a hard-input decoder.

26. The data storage device of claim 25, wherein the decoder is a Bose-Chaudhuri-Hocquenghem (BCH) decoder.

27. The data storage device of claim 22, wherein the controller includes a page combiner, and wherein the page combiner is configured to generate the third logical page.

28. The data storage device of claim 22, wherein the memory includes read/write circuitry, wherein the first value is modified in response to reliability information indicating that the second value has a higher reliability than the first value, and wherein the read/write circuitry is configured to generate the reliability information using a soft read technique.

29. The data storage device of claim 28, wherein the reliability information includes log-likelihood ratio (LLR) values associated with the first logical page or the second logical page.

30. The data storage device of claim 22, wherein the memory is a non-volatile memory having a three-dimensional (3D) memory configuration that is monolithically formed in one or more physical levels of arrays of memory cells having an active area disposed above a silicon substrate, and wherein the data storage device includes circuitry associated with operation of the memory cells.

* * * * *